(12) United States Patent
Matsuyama et al.

(10) Patent No.: US 9,004,788 B2
(45) Date of Patent: Apr. 14, 2015

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventors: Kenichirou Matsuyama, Kumamoto (JP); Tomohiro Kaneko, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 219 days.

(21) Appl. No.: 13/862,526

(22) Filed: Apr. 15, 2013

(65) Prior Publication Data
US 2013/0236838 A1 Sep. 12, 2013

Related U.S. Application Data

(62) Division of application No. 12/796,160, filed on Jun. 8, 2010, now Pat. No. 8,448,600.

(51) Int. Cl.
G03D 5/00 (2006.01)
G03F 7/20 (2006.01)
H01L 21/67 (2006.01)
H01L 21/677 (2006.01)

(52) U.S. Cl.
CPC .............. *G03F 7/20* (2013.01); *H01L 21/6715* (2013.01); *H01L 21/67178* (2013.01); *H01L 21/67276* (2013.01); *H01L 21/67745* (2013.01); *H01L 21/67769* (2013.01)

(58) Field of Classification Search
USPC ......................................................... 396/611
See application file for complete search history.

(56) References Cited

U.S. PATENT DOCUMENTS

| 6,009,890 A * | 1/2000 | Kaneko et al. ................. 134/133 |
| 8,448,600 B2 * | 5/2013 | Matsuyama et al. .......... 118/695 |
| 2005/0111938 A1 * | 5/2005 | van der Meulen ............ 414/217 |
| 2007/0269297 A1 * | 11/2007 | Meulen et al. ........... 414/222.01 |
| 2007/0286710 A1 * | 12/2007 | van der Meulen et al. ... 414/217 |
| 2008/0124197 A1 * | 5/2008 | van der Meulen et al. ... 414/217 |
| 2008/0129968 A1 * | 6/2008 | Hayashida et al. ............. 355/27 |
| 2009/0000908 A1 * | 1/2009 | Brain et al. ................ 198/349.6 |
| 2009/0021704 A1 * | 1/2009 | Kaneko et al. .................. 355/27 |
| 2014/0271083 A1 * | 9/2014 | Caveney .................... 414/749.5 |

FOREIGN PATENT DOCUMENTS

| JP | 05-275511 A | 10/1993 |
| JP | 11-330037 A | 11/1999 |
| JP | 2009-026916 A | 2/2009 |

* cited by examiner

*Primary Examiner* — Rodney Fuller
(74) *Attorney, Agent, or Firm* — Abelman, Frayne & Schwab

(57) ABSTRACT

A substrate processing apparatus is disclosed equipped with a transfer mechanism that transfers a substrate processed at a processing block to a carrier so that the increase of the number of transfer process is suppressed, improving the processing efficiency. The substrate processing apparatus is configured in such a way that, when a second-transfer module houses at least one substrate and a carrier that can house the at least one substrate is not placed in a carrier-placement unit, the at least one substrate is transferred to a buffer module. When the second transfer module houses at least one substrate and the carrier that can house the at least one substrate is placed in the carrier-placement unit, the at least one substrate is transferred to the carrier, regardless of whether or not a substrate is being transferred from the buffer module to the carrier.

6 Claims, 12 Drawing Sheets

SUBSTRATE PROCESSING APPARATUS, SUBSTRATE PROCESSING METHOD, AND STORAGE MEDIUM

CROSS REFERENCE TO RELATED APPLICATIONS

This application is a divisional of U.S. patent application Ser. No. 12/796,160, filed Jun. 8, 2010 which is incorporated herein by reference.

TECHNICAL FIELD

The present disclosure relates to a substrate processing apparatus equipped with a transfer mechanism that transfers substrates processed at a processing block with a carrier. The present invention also relates to a substrate processing method and storage medium based on the substrate processing apparatus.

BACKGROUND

A photolithography has been known where a resist pattern is formed on a substrate in fabricating semiconductor devices or LCD substrates. The photolithography includes a series of processes including applying a resist to a semiconductor wafer ("wafer" hereinafter) to form a resist film on the wafer, and developing the wafer after exposing the wafer formed with the resist film to a light using a photomask, thereby obtaining a desired pattern.

These processes are generally performed using a resist application/development apparatus connected with an exposure apparatus. The resist application/development apparatus includes a carrier block where a carrier, called FOUP that houses a plurality of wafers, is introduced, and a processing block that includes processing mechanisms each performs a resist application process and a developing process. The carrier block includes a load-port equipped with a carrier-placement unit to place the carrier.

When the carrier is transferred to the load-port, wafers inside the carrier is transferred to a carry-in module to carry in the wafers into the processing block by a transfer mechanism such as, for example, a transfer arm installed in the carrier block. The wafers transferred to the carry-in module is brought into the processing block by a transfer arm installed in the processing block where a resist is applied to each wafer. After the resist is applied, the wafers are transferred to an exposure apparatus for an exposure treatment of the wafers. The wafers are then returned to the processing block by a transfer mechanism for a development process. Subsequently, the wafers are transferred from the processing block to the carry-out module for a transfer to the carrier block by the transfer mechanism, and returned from the carry-out module to the carrier by, for example, the transfer arm. Herein, the term "module" is used to indicate where the wafers are transferred.

As described above, when the carrier is placed in the carrier-placement unit of the load-port while the wafers are carried into and out of the carrier, a next carrier may not be transferred to the carrier-placement unit. As a result, the wafers may not be positioned appropriately on the processing module of the processing block and the exposure apparatus, that would have been processed otherwise, thereby reducing the work processing amount.

In view of the above, a stocker has been considered equipped with a retreat-area where the carrier is retreated temporarily. In this instance, after the wafers are unloaded from a first carrier (a starting carrier) transferred to the carrier-placement unit of the carrier-port, the first carrier is retreated to the retreat-area, and a second carrier (a secondary carrier) is placed in the carrier-placement unit to unload the wafers. Subsequently, after the wafers are unloaded from the second carrier, the second carrier is retreated to the retreat-area, and the first carrier is placed back into the carrier-placement unit so that the wafers, transferred from the first carrier and processed at the processing block, are returned to the first carrier. As described above, the work processing amount is expected to be improved by transferring the carrier between the carrier-placement unit and the retreat-area, because of an increased number of wafers unloaded from the carrier to the processing block and improved operating rate of the processing block and the exposure apparatus.

However, in a system where the carrier is transferred between the carrier-placement unit and the stocker, there may be a chance when the carrier that can house specific wafers is not placed in the carrier-placement unit when the specific wafers are transferred to the carry-out module. Here, in the processing block, the wafer takes a sequential process by transferring through the later part of the processing block according to an order that each of the wafers is entered, because, for example, processing conditions such as a processing time and temperatures of the wafers may vary on each lot. Namely, the transfer of the wafers in the processing block is controlled in such a way that a wafer transferred to the processing block later does not bypass a wafer transferred to the processing block earlier.

As a result, when a wafer is being held at the carry-out module for a relatively long time, the transfer of another wafer from the processing block needs to be halted, and an enough improvement of the work processing amount may not be achieved. Accordingly, a carry-out buffer module that can house a plurality of wafers is devised so that the wafers in the carry-out module are transferred to the carry-out buffer module by a transfer arm of the carrier block, and, after staying at the carry-out buffer module for a predetermined of time, the wafers at the carry-out buffer module are returned to the carrier by the transfer arm.

When the carry-out buffer module is installed, for example, the wafers may be carried to the carrier after all of the wafers are transferred to the carry-out buffer module, according to the order that the wafers are transferred to the carry-out module, thereby making a transfer sequence similar to the transfer operation in the processing block where a wafer brought into the processing block later does not bypass a wafer brought into the processing block earlier. However, in this situation, the wafers may be transferred to the carry-out buffer module even when the carrier is placed in the carrier-placement unit so that the wafers do not need to be transferred to the carry-out buffer module, thereby unnecessarily increasing the number of transfer operations by the transfer arm. The transfer time of the wafers from the carry-out module to the carrier is longer when the wafers are transferred to the carrier via the carry-out buffer module, as compared to the transfer time where the wafers are transferred from the carry-out module to the carrier directly, because an extended time is required for transferring the wafers from the carry-out module to the carrier. Also, since the number of transfer operations is increased, there is concern that a sufficient improvement of the work processing amount may not be achieved.

SUMMARY

A substrate processing apparatus is disclosed where the number of transfer operations can be decreased thereby improving the operation efficiency of the apparatus. The substrate processing apparatus comprises a carrier-placement unit configured to place a carrier that carries a plurality of substrates; a retreat-placement unit for retreating an unloaded carrier from the carrier-placement unit, where the unloaded carrier is a carrier from which the plurality of substrates are taken out; a carrier block equipped with a carrier-transfer mechanism configured to transfer the carrier between the carrier-placement unit and the retreat-placement unit; a processing block including one or more processing modules that process the plurality of substrates one by one; a first-transfer module configured to temporarily place the plurality of substrates from the carrier before the plurality of substrates are transferred to the processing block; a second-transfer module configured to temporarily place the plurality of substrates processed by the processing block; a buffer module configured to place the plurality of substrates taken out from the second-transfer module so that the plurality of substrates taken out from the second-transfer module can be held before the plurality of substrates are returned to the carrier; a first-transfer mechanism configured to transfer the plurality of substrates between the carrier placed in the carrier-placement unit, the first transfer module and the second transfer module; a second-transfer mechanism configured to transfer the plurality of substrates between the first-transfer module, the second-transfer module and a module disposed in the processing block, where the second-transfer mechanism transfers the plurality of substrates in such a way that a substrate brought to the first-transfer module later does not bypass a substrate brought to the first-transfer module earlier; and a control unit configure to output control signals to each unit of the substrate processing apparatus to control the operation of each unit of the substrate processing apparatus.

In particular, the substrate processing apparatus is configured in such a way that when the second-transfer module houses at least one substrate and the carrier that can house the at least one substrate is not placed in the carrier-placement unit, the control unit outputs a control signal so that the at least one substrate housed in the second-transfer module is transferred to the buffer module. The substrate processing apparatus is further configured in such a way that when the second-transfer module houses at least one substrate and the carrier that can house the at least one substrate is placed in the carrier-placement unit, the control unit outputs a control signal so that the at least one substrate housed in the second-transfer module is transferred to the carrier, regardless of whether or not a substrate is being transferred from the buffer module to the carrier.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
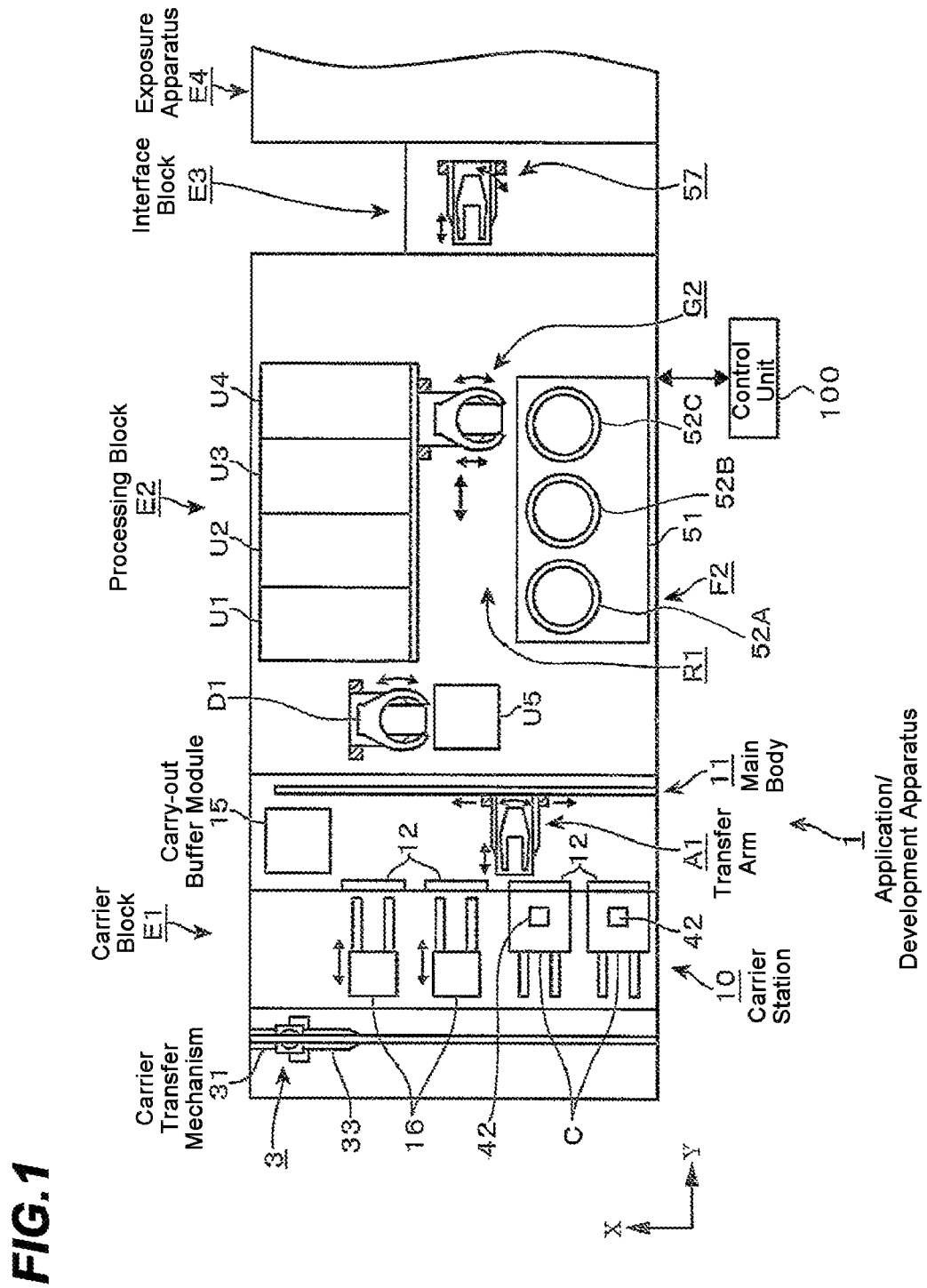
FIG. 1 is a plan view of a resist application/development apparatus according to the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

One of the goals of the present disclosure is to provide a substrate processing apparatus equipped with a transfer mechanism that transfers substrates processed by a processing block to a carrier. In particular, the substrate processing apparatus is configured to reduce the number of transfer operations by the transfer mechanism thereby improving the work processing amount. The present disclosure also provide a substrate processing method based on the substrate processing apparatus, and a storage medium that stores a program that executes the substrate processing method.

According to an aspect of the present disclosure, the substrate processing apparatus comprises a carrier-placement unit configured to place a carrier carrying a plurality of substrates; a retreat-placement unit for retreating an unloaded carrier from the carrier-placement unit, where the unloaded carrier means a carrier where the plurality of substrates are taken out from the carrier; a carrier block equipped with a carrier-transfer mechanism configured to transfer the carrier between the carrier-placement unit and the retreat-placement unit; a processing block including one or more processing modules that process the plurality of substrates one by one; a first-transfer module configured to temporarily place the plurality of substrates from the carrier before the plurality of substrates are transferred to the processing block; a second-transfer module configured to temporarily place the plurality of substrates processed by the processing block; a buffer module configured to house the plurality of substrates taken out from the second-transfer module so that the plurality of substrates taken out from the second-transfer module can be held before the plurality of substrates are returned to the carrier; a first-transfer mechanism configured to transfer the plurality of substrates between the carrier placed in the carrier-placement unit, the first-transfer module and the second-transfer module; a second-transfer mechanism configured to transfer the plurality of substrates between the first-transfer module, the second-transfer module and a module disposed in the processing block, where the second-transfer mechanism transfers the plurality of substrates in such a way that a substrate brought to the first-transfer module later does not bypass a substrate brought to the first-transfer module earlier; and a control unit configure to output control signals to each unit of the substrate processing apparatus to control the operation of each unit of the substrate processing apparatus. In particular, the substrate processing apparatus of the present disclosure is configured in such a way that when the second-transfer module houses at least one substrate and the carrier that can house the at least one substrate is not placed in the carrier-placement unit, the control unit outputs a control signal so that the at least one substrate housed in the second-transfer module is transferred to the buffer module. The substrate processing apparatus of the present disclosure is further configured in such a way that when the second-transfer module houses at least one substrate and the carrier that can house the at least one substrate is placed in the carrier-placement unit, the control unit outputs a control signal so that the at least one substrate housed in the second-transfer module is transferred to the carrier, regardless of whether or not a substrate is being transferred from the buffer module to the carrier.

In the substrate processing apparatus, the substrate transferred to the buffer module may be transferred to the carrier, when the carrier that can house the substrate is placed in the carrier-placement unit, when there is no substrate being transferred in the second-transfer module, and when there is no substrate being transferred from the carrier to the first transfer module. The substrate transferred to the buffer module may be transferred to the carrier, when the carrier that can house the substrate is placed in the carrier-placement unit and another carrier that can house a substrate transferred to the second-transfer module is not placed in the carrier-placement unit. In particular, the substrate processing apparatus includes a plurality of the second transfer modules, and a substrate transfer operation is performed from the buffer module to the carrier when each of the plurality of the second-transfer modules houses at least one substrate, and the substrate transfer operation is not performed from the buffer module to the carrier when at least one of the plurality of the second transfer modules does not house a substrate.

Moreover, the substrate processing apparatus includes a resist application apparatus and a developing apparatus, and the processing module includes a resist application module that supplies a resist to the substrate, and a resist developing module that develops the substrate by supplying a developing solution to the substrate applied with the resist and exposed to an exposure device subsequently.

According to another aspect of the present disclosure, a substrate processing method comprises placing a carrier that houses a plurality of substrates into a carrier-placement unit; transferring the carrier between a retreat-placement unit prepared for retreating an unloaded carrier and a carrier-placement unit, where the unloaded carrier is a carrier where the plurality of substrates are taken out from the carrier; processing the plurality of substrates one by one by one or more processing modules disposed at a processing block; transferring the plurality of substrates by a first-transfer mechanism between a carrier placed in a carrier-placement unit, a first-transfer module, a second-transfer module, and a buffer module, where the first-transfer module is configured to temporarily place the plurality of substrates from the carrier before the plurality of substrates are transferred to the processing block, the second-transfer module is configured to temporarily place the plurality of substrates processed by the processing block, and the buffer module is configured to house the plurality of substrates taken out from the second-transfer module so that the plurality of substrates taken out from the second-transfer module can be held before the plurality of substrates are returned to the carrier; transferring the plurality of substrates by a second-transfer mechanism between the first-transfer module, the second-transfer module and a module disposed in the processing block, where the second-transfer mechanism transfers the plurality of substrates in such a way that a substrate brought to the first-transfer module later does not bypass a substrate brought to the first-transfer module earlier; when the second-transfer module houses at least one substrate and the carrier that can house the at least one substrate is not placed in the carrier-placement unit, transferring the at least one substrate housed at the second-transfer module to the buffer module; and when the second-transfer module houses at least one substrate and the carrier that can house the at least one substrate is placed in the carrier-placement unit, transferring the at least one substrate housed in the second-transfer module to the carrier, regardless of whether or not a substrate is being transferred from the buffer module to the carrier.

Moreover, the substrate processing method further comprises transferring a substrate transferred to the buffer module to the carrier, when the carrier that can house the substrate is placed in the carrier-placement unit, when there is no substrate being transferred in the second-transfer module, and when there is no substrate being transferred from the carrier to the first-transfer module.

The substrate processing method further comprising transferring a substrate transferred to the buffer module to the carrier, when the carrier that can house the substrate is placed in the carrier-placement unit and another carrier that can house a substrate transferred to the second-transfer module is not placed in the carrier-placement unit. In particular, the substrate processing apparatus includes a plurality of the second-transfer modules, and a substrate transfer operation is performed from the buffer module to the carrier when each of the plurality of the second transfer modules houses at least one substrate, and the substrate transfer operation is not performed from the buffer module to the carrier when at least one of the plurality of the second-transfer modules does not house a substrate.

In the substrate processing method, the processing step that processes the plurality of substrates one by one further includes applying a resist, and applying a developing solution after the resist is applied on the substrate and the substrate applied with the resist is exposed to a light.

According to yet another aspect of the present disclosure, a computer-readable medium storing a computer program that, when executed, causes a computer to control the substrate processing apparatus to perform the substrate processing method as described above. In particular, the substrate processing apparatus comprises a processing block including one or more processing modules that process the plurality of substrates one by one, and a transfer mechanism that transfers at least one of the plurality of substrates processed at the processing block to the carrier.

According to yet another aspect of the present disclosure, when there is substrate in the carry-out module and the carrier that can house the substrate is not placed in the carrier-placement unit, the substrate in the carry-out module is transferred to the carry-out buffer module. When there is a substrate in the carry-out module and the carrier that can house the substrate is placed in the carrier-placement unit, the substrate in the carry-out module is transferred to the carrier regardless of whether or not there is substrate being transferred from the carry-out buffer module to the carrier. As a result, the number of transfer operations is reduced by the transfer mechanism between the carrier, carry-out buffer module and carry-out module, as compared to the case where all of the substrates are transferred to the carrier via the carry-out buffer module. In the embodiment of the present disclosure, since the substrates can be returned to the carrier promptly, the work processing amount may be improved.

Figure 2:
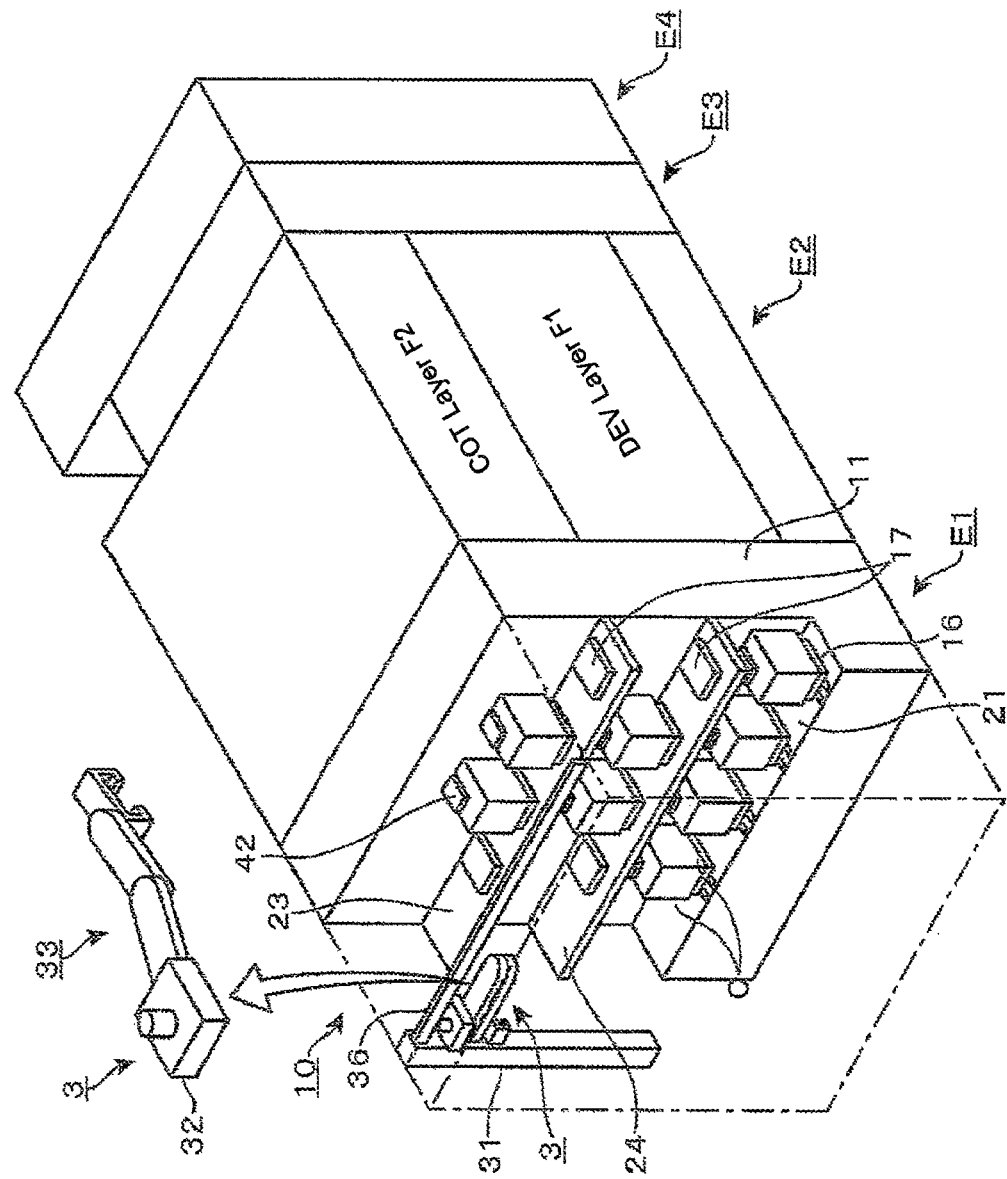
FIG. 2 is a perspective view of the resist application/development apparatus.
Figure 3:
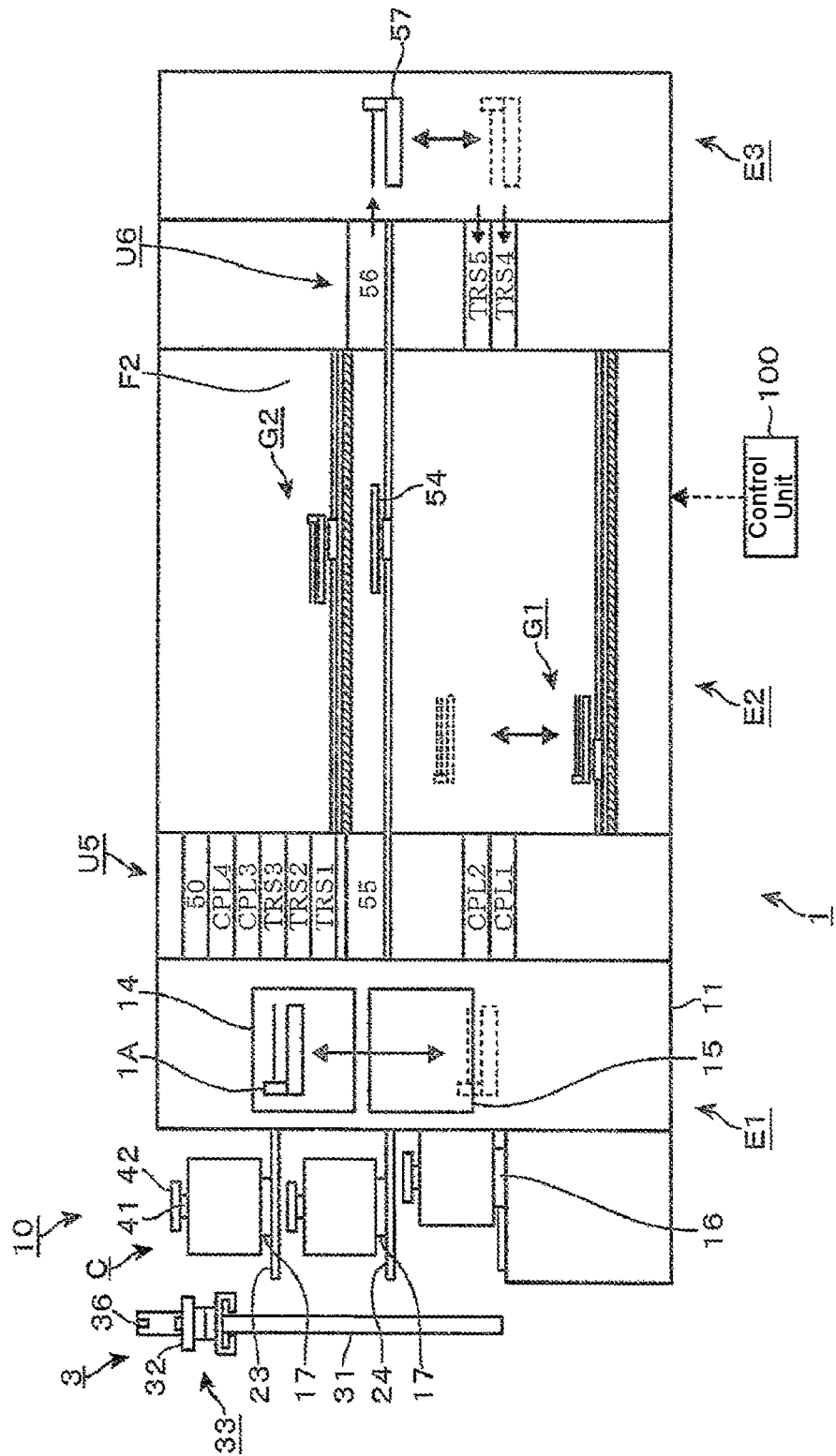
FIG. 3 is a view showing an end-side of the resist application/development apparatus.

A resist application/development apparatus is explained hereinafter as an exemplary embodiment of the substrate processing apparatus of the present disclosure. FIG. 1 shows a plan view of a resist pattern forming system including a resist application/development apparatus 1 connected to an exposure apparatus E4. FIG. 2 is a perspective view of resist application/development apparatus 1 of FIG. 1, and FIG. 3 is a longitudinal cross-sectional view of resist application/development apparatus 1. Resist application/development apparatus 1 includes a carrier block E1 where a carrier (C) that can house a plurality of wafers (W) is introduced, a processing block E2 that applies a resist to the wafers and develops the wafers applied with the resist, and an interface block E3.

Carrier block E1 is equipped with a carrier station 10 where the carrier (C) is introduced, a main body 11 that constitute a transfer area of the wafer (W) connected to carrier station 10. Numeral 12 indicates an open/close unit that opens/covers a cover of the carrier (C) placed in a carrier-placement unit 16 installed in carrier station 10, and connects/divides the inside of the carrier (C) and main body 11.

A carry-in buffer module 14 and a carry-out buffer module 15 are installed, for example, as a stack inside main body 11, and each of the buffer modules can house, for example, six wafers (W). Carry-in buffer module 14 is where the wafers (W), unloaded or taken out from the carrier (C) to be transferred to processing block E2, are held, and assumes a role for a quick completion of an unloading process of the wafers from the carrier (C). Carry-out buffer module 15 is where the wafers (W), to be transferred to the carrier (C) after completing the process at processing block E2, are held, and assumes a role for preventing a situation where transfer of the wafers (W) from processing block E2 is halted.

In carrier block E1, carrier (C), carry-in buffer module 14, carry-out buffer module 15, and a transfer arm 1A are disposed. Transfer arm 1A is a first-transfer mechanism that transfers wafers (W) between each modules installed in a shelf unit U5, which will be described later. To transfer the wafers (W), transfer arm 1A is configured to move and elevate along the Y-direction orthogonal to the arrangement direction of each blocks E1, E2, E3 (X-direction), and configured to rotate and move back-and-forth direction along a vertical shaft.

Carrier station 10 includes a load port 21 equipped with, for example, four carrier-placement units 16 where the carrier (C) is placed to exchange the wafers (W) to and from the transfer arm 1A. Carrier station 10 further includes a stocker 22, formed with an upper-side shelf 23 and a lower-side shelf 24 on an upper side of load port 21, to retreat the carrier (C) temporarily. There are, for example, eight retreat-placement units 17 (retreat-area) on each of shelfs 23, 24 where the carrier (C) is retreated temporarily.

Figure 4:
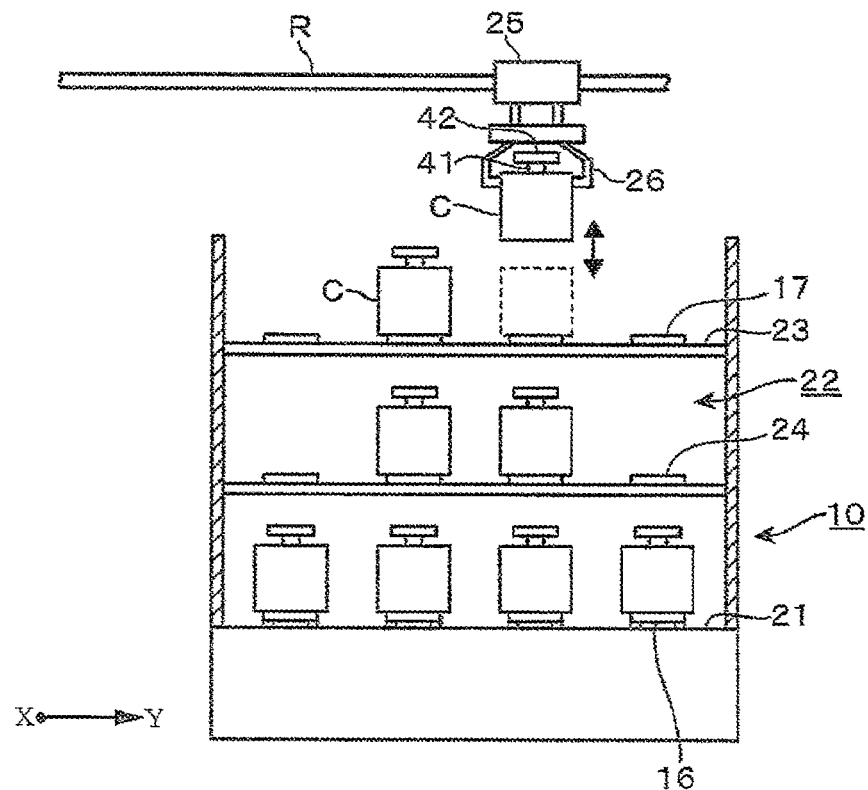
FIG. 4 a front view of the resist application/development apparatus viewed from a carrier-transfer mechanism side.
Figure 5:
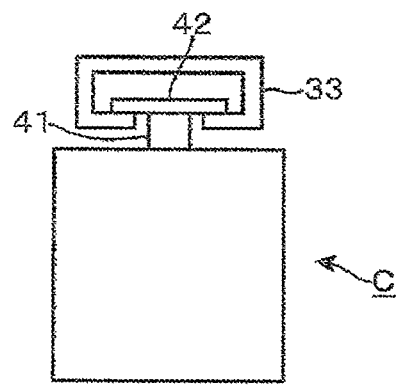
FIG. 5 is a front view of a carrier.

Referring to FIG. 4, there is provided a rail (R) on an upper side of shelf 23 that extends along the Y-direction of the figure. The rail (R) is equipped with an outside carrier transfer mechanism 25 that transfers the carrier (C) between application/development apparatus 1 and an outside processing unit so that the carrier (C) can move along the rail (R). A holding unit 26 is provided outside carrier-transfer mechanism 25 so that the carrier (C) can be held on both sides. Holding unit 26 is configured to be elevated so that holding unit 26 can transfer the carrier (C) between shelf 23 and retreat-placement unit 17.

As illustrated in FIGS. 1 through 3, carrier block E1 further includes a carrier-transfer mechanism 3 to transfer the carrier (C) with respect to each placement units 16, 17 of carrier station 10. Carrier-transfer mechanism 3 is provided with a base unit 32 configured to elevate along an elevating shaft 31, and a transfer arm 33 having a universal joint that can be connected to base unit 32 and configured to rotate along a vertical shaft with respect to base unit 32. Elevating shaft 31 is configured, for example, to move along a guide rail 36 installed to extend from a top side of carrier block E1 along the Y-direction of FIG. 1.

Regarding the shape of the carrier (R), as illustrated in FIGS. 2 through 4, a flat-shaped holding plate 42 is installed through a supporting unit 41 on a top portion of the carrier (C). Transfer arm 33 is, for example, transfers the carrier (C) to each of carrier-placement unit 16 and retreat-placement unit 17 by surrounding holding unit 42 of the carrier (C) and supporting the carrier (R) with a suspension state.

Referring to FIG. 2, processing block E2 is formed by stacking from a lower side a first block (DEV layer) F1 that performs a developing process, and a second block (COT layer) F2 that applies a resist to form a resist film on the substrate.

Assuming that each layer of processing block E2 has a similar structure, taking the second block (COT layer) F2 for example, COT layer F2 is equipped with a resist-layer forming unit 51. In this example, resist-layer forming unit 51 is equipped with resist-applying modules (COT) 52A, 52B, 53C. Furthermore, COT layer F2 includes shelf units U1, U2, U3, U4 that form a processing-module group that performs a pre-processing and a post-processing performed by resist-application module 52, and a transfer arm G2 installed between resist-layer forming unit 51 and processing modules of a heating/cooling system to transfer wafers (W) between resist-layer forming unit 51 and processing modules of heating/cooling meter.

Shelf units U1, U2, U3, U4, formed by stacking modules, are arranged along with a transfer area R1 where transfer arm G2 moves. Shelf units U1, U2, U3, U4, includes a heating module equipped with a heating plate to heat wafers (W) placed in shelf units U1, U2, U3, U4. The heating modules include hydrophobic modules (ADH) 61A, 61B that heat the wafers (W) before the resist is applied while providing a gas for a hydrophobic treatment, and heating modules 62A, 62B, 62C that heat the wafers (W) after the resist is applied.

There is provided a development-processing unit inside a single DEV layer F1 with a stacked structure of two layers. The development-processing unit corresponds to resist-layer forming unit 51 and includes development modules (DVE) 64A, 64B, 64C, 64D, 64E, 64F. The development-processing unit has a similar structure to resist-layer forming unit 51, except that a developing solution is provided to the wafers (W) as a chemical solution. Moreover, a transfer arm G1 is installed inside DEV layer F1 configured to transfer the wafers (W) to the two-layer development processing unit, and the heating/cooling system. Accordingly, transfer arm G1 is commonly provided to the two-layer development processing unit. Moreover, DEV layer F1, like COT layer F2, is equipped with shelf units U1, U2, U3, U4, and these shelf units are equipped with heating modules 63A, 63B, 63C, 63D, 63E, 63F.

Each of heating modules 63A, 63B, 63C, 63D, 63E, 63F, resist-application modules (COT) 52A, 52B, 52C, and development modules (DEV) 64A, 64B, 64C, 64D, 64E, 64F processes introduced wafers (W) one by one. Each of transfer arms G that forms the second-transfer mechanism of processing block E2 is equipped with two supporting objects of the wafers (W), so that a wafer (W), transferred from a predetermined module to processing block E2 earlier by one of the supporting objects, is carried out first, and another wafer (W) transferred from the predetermined module to processing block E2 later by the other supporting object is carried in. Furthermore, each of the transfer arms (G), based on a predetermined transfer schedule, sequentially transfers the wafers (W) placed in an upper side module to a lower side module one by one, making a single cycle for each transfer path. As a result, a wafer (W), carried from the carrier (C) into processing block E2 earlier than a wafer (W) carried into processing block E2 later from the carrier (C), is positioned at a lower side module, and the wafers (W) move between each of the modules while each of the transfer arms (G) travels periodically through the modules.

A shelf unit U5 is additionally installed at processing block E2 close to carrier block E1 side, as illustrated in FIGS. 1 through 3. Shelf unit U5 includes transfer modules TRS1, TRS2, TRS3, transfer modules CPL1, CPL2, CPL3, CPL4 and buffer module 50, and each of the modules is stacked each other. Moreover, shelf unit U5 further includes a carry-in unit 55 to transfer wafers (W) to a shuttle 54, which will be described later. The transfer modules (TRS and CPL) is equipped with a stage that place wafers (W), and CPL further includes a temperature control function for the placed wafers (W).

Transfer modules TRS1, TRS2, TRS3, CPL1, CPL2 are installed at a place where transfer arm A1 can access, and transfer modules CPL1, CPL2 are installed at a place where transfer arm G1 can access. Moreover, transfer modules CPL3, CPL4 and buffer module 50 are installed at a place where transfer arm G2 can access. In this example, each of transfer modules TRS1, TRS2, TRS3 is set up as a carry-in module (a first-transfer module) where wafers (W) are placed temporarily before the wafers (W) are carried in to processing block E2, and each of transfer modules CPL1, CPL2 is set up as a carry-out module (a second-transfer module) where wafers (W) are placed temporarily after the wafers (W) are processed at processing block E2 but before the wafers (W) are returned to the carrier (C).

A transfer arm D1 is installed near shelf unit U5 configured to elevate and make a back-and-forth movement to transfer wafers (W) between the modules that constitute shelf unit U5.

A shelf unit U6 is installed at processing block E2 close to an interface block E3 side, as illustrated in FIG. 3. Shelf unit U6 includes transfer modules TRS4, TRS5 stacked each other, and a carry-out unit 56 configured to take out wafers (W) from shuttle 54. Shuttle 54 is installed at an upper portion of DEV layer F1 configured to transfer wafers (W) directly from carry-in unit 55 of shelf unit U5 to carry-out unit 56 of shelf unit U6.

Interface block E3 is equipped with an interface arm 57 that transfers wafers (W) between the modules of shelf unit U6 and exposure apparatus E4.

Resist application/development apparatus 1 includes a control unit 100 built with, for example, a computer. Control unit 100 includes a data processing unit built with a computer program, a memory device and a CPU. The computer program includes commands (each step) to perform processing procedures (which will be described later) by issuing control signals from control unit 100 to each unit of resist application/development apparatus 1. In particular, the memory device, for example, includes a storage area that stores processing parameters such as a processing temperature, a processing time, a supply amount of each chemical solution and an electric value. When the CPU executes each of the commands of the computer program, the processing parameters are interpreted and control signals are delivered to each unit of resist application/development apparatus 1 based on the parameter values.

The computer programs, including programs regarding input controls or display of the processing parameters, are stored at a computer-storage medium such as flexible disk, compact disk, hard disk, magneto optical (MO) disk or a memory card, which are installed into control unit 100.

Moreover, the computer program is devised in such a way that a plurality of wafers (W) stacked on a vertical direction in each of carriers (C) can be transferred to processing block E2 according to the stacked order. Each carrier (C) may house wafers (W) of the same lot where the wafers (W) are processed with substantially same conditions at processing block E2, or may house wafers (W) of multiple lots where the wafers (W) of each lot are processed with different conditions. When a carrier (C) houses wafers (W) of different lots, wafers (W) of the same lot are placed sequentially, and all of the wafers (W) in the same lot are transferred to processing block E2 before wafers (W) of a next lot are introduced into processing block E2 for a processing. In particular, control unit 100 assigns sequence numbers to wafers (W) of each lot in a single carrier (C), starting from one (1) according to a sequence that the wafers (W) are carried in to processing block E2. Accordingly, a wafer (W) having a higher sequence number may not bypass a wafer (W) having a lower sequence number. Transfer operations are performed in carrier block E1 according to this sequence numbers, as described later.

The processing parameters may include a supply time or temperature of the chemical solution supplied to the wafers (W), heating/cooling temperature of the wafers (W) and processing time of the wafers (W). Also, for example, until the carrier (C) is introduced into resist application/development apparatus 1, information such as the number of lots in a carrier (C) and the number of wafers (W) in each lot are transmitted from a higher computer that controls the transfer of the carrier (C) between apparatuses including resist application/development apparatus 1, to control unit 100, and control unit 100 controls the transfer operation, based on the transmitted information, which will be described later.

A transfer path of a carrier (C) in resist application/development apparatus 1 is described hereinafter. A carrier (C) (a starting carrier) transferred to retreat-placement unit 17 of shelf unit 23 by an outside carrier transfer mechanism 25, is placed in carrier-placement unit 16 by carrier-transfer mechanism 3. After all of the wafers (W) are unloaded from the starting carrier (C), the starting carrier (C) is transferred to retreat-placement unit 17 of shelf unit 23 or shelf unit 24, by transfer mechanism 3. Subsequently, another carrier (C) (a secondary carrier) is transferred to carrier-placement unit 16 by carrier-transfer mechanism 25 following the same path as the starting carrier (C), and the wafers (W) are unloaded from the secondary carrier (C).

The secondary carrier (C) is transferred to retreat-placement unit 17 following the same path as the starting carrier (C), after the wafers (W) are unloaded from the secondary carrier (C). Afterward, the starting carrier (C) is transferred back to carrier-placement unit 16 by carrier-transfer mechanism 3, and the processed wafers (W) unloaded from the starting carrier (C) are transferred to the starting carrier (C) placed in carrier-placement unit 16. After that, the starting carrier (C) is placed in retreat-placement unit 17 of shelf unit 23, and taken out from resist application/development apparatus 1 by an outside carrier transfer unit 25. Thereafter, like the starting carrier (C), the secondary carrier (C) is transferred to carrier-placement unit 16 again, and the processed wafers (W) unloaded from the secondary carrier (C) are carried in to the secondary carrier (C) placed in carrier-placement unit 16. Subsequently, the secondary carrier (C) is taken out from resist application\development apparatus 1 following the same path as the starting carrier (C). Because there are four carrier-placement units 16, each carrier is not limited to return the same carrier-placement unit 16 that unloaded the wafers (W).

Figure 6:
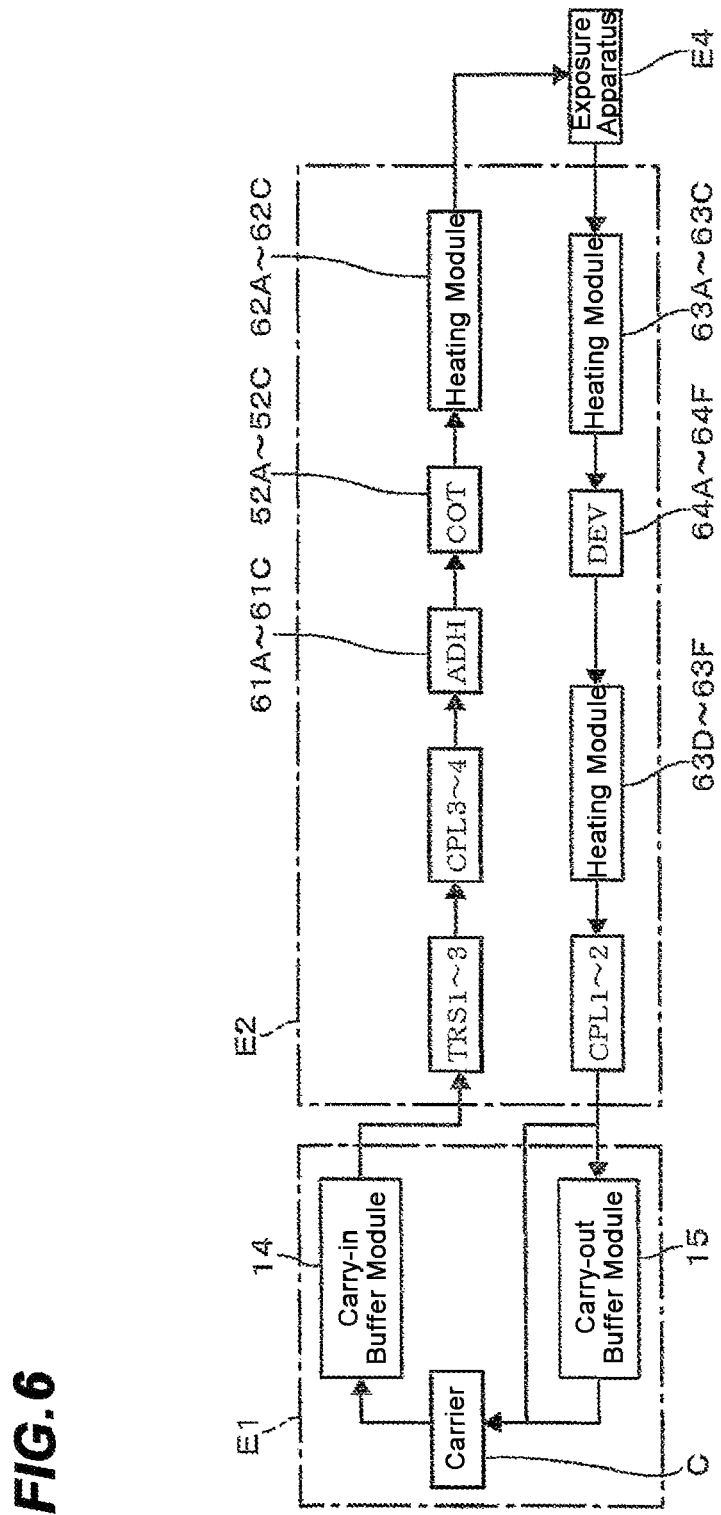
FIG. 6 is a transfer path in the resist application/development apparatus.

Referring to FIG. 6, a description regarding the transfer path of wafers (W) continues. Once a carrier (C) is placed in carrier-placement unit 16 as described above, the cover of the carrier (C) is uncovered by open/close unit 12, and the wafers (W) are transferred from the carrier (C) to carry-in buffer module 14 for a moment by transfer arm 1A. After staying at carry-in buffer module 14 for a predetermined time, the wafers (W) are transferred to one of transfer modules TRS1, TRS2, TRS3.

The wafers (W) are transferred from transfer modules TRS1, TRS2, TRS3 to transfer modules (CPL3 or CPL4), by transfer arm D1, and further transferred following one of sequences from hydrophobic modules ADH (61A or 61B) of shelf units U1, U2, U3, U4 to resist application modules COT (52A, 52B, 52C) by transfer arm G2 of COT layer F2. After the resist is applied, the wafers (W) are transferred to heating modules 62A, 62B, 62C of shelf units U1, U2, U3, U4 by transfer arm G2 for a heat treatment, thereby forming a resist layer on each wafer (W).

Subsequently, after transferred to buffer module 50 by transfer arm G2, the wafers (W) are transferred to carry-in unit 55 by transfer arm D1 to be delivered to shuttle 54 and transferred to carry-out unit 56. After that, the wafers (W) are transferred to interface arm 57 and exposure apparatus E4 for an exposure treatment.

Later, the wafers (W) are transferred to transfer modules (TRS4 or TRS 5), and further transferred to either one of heating modules (either one of 63A, 63B or 63C) of shelf units U1, U2, U3, U4 by transfer arm G1. The wafers (W) are then processed for a heat treatment (PEB process). Subsequently, the wafers (W) are transferred to developing module DEV by transfer arm G1 for a developing process, and transferred to either one of heating modules 63D, 63E, 63F of shelf units U1, U2, U3, U4 for a heat treatment. After the heat treatment, the wafers (W) are transferred to CPL1 or CPL2 of shelf unit U5 by transfer arm G1.

Afterward, the wafers (W) are either returned to the carrier (C) directly where the wafers (W) are unloaded by transfer arm 1A, or transferred to carry-out buffer module 15 for a moment and then carried in to the carrier (C). A description will follow regarding on which case the wafers (W) are transferred to carry-out buffer module 15, or returned to the carrier (C) directly.

Figure 7:
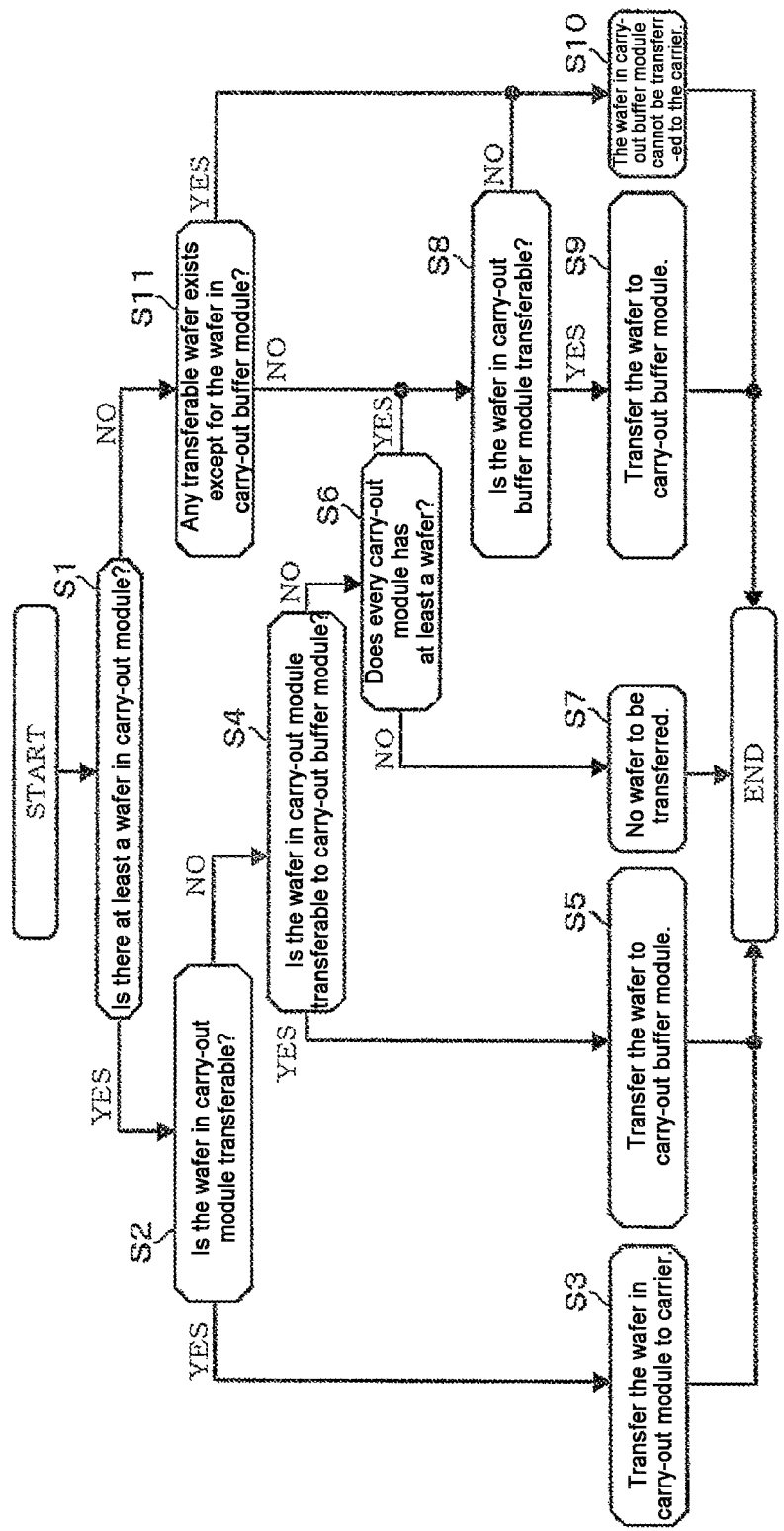
FIG. 7 is a flow chart illustrating a transfer operation at the carrier block by a control unit.

Referring to FIG. 7 illustrating a flow chart of the processes, determination processes performed by control unit 100 are explained where the wafers (W) processed at processing block E2 are returned from transfer modules CPL1, CPL2 of shelf unit U5 to carrier (C). A series of determinations and the operations by transfer arm 1A based on the determinations are performed by each cycle where transfer arms G1, G2 of processing block E2 travel around the transfer path.

Control unit 100 determines whether there is a wafer (W) in transfer modules (CPL1, CPL2) set up as carry-out modules (step S1). If it is determined that there is a wafer (W) in transfer modules CPL1, CPL2, control unit 100 determines whether the wafers (W) in transfer modules CPL1, CPL2 can be transferred to the carrier (C) from which the wafers (W) are carried out (step S2). If it is determined that the carrier (C) is already returned from retreat-placement unit 17 to carrier-placement unit 16, control unit 100 determines that the wafers (W) in transfer modules CPL1, CPL2 may be transferred to the carrier (C) at step S2, and the wafers (W) in carrier transfer modules CPL1, CPL2 are transferred to the carrier (C) by transfer arm A1 (step S3).

If, however, it is determined that the wafers (W) may not be transferred to the carrier (C) because the carrier (C) that unloaded the wafers (W) in transfer modules CPL1, CPL2 is not returned to carrier-placement unit 16, control unit 100 determines whether the wafers (W) in transfer modules CPL1, CPL2 can be transferred to carry-out buffer module 15 (step S4). If it is determined that there is a space in carry-out buffer module 15, control unit 100 determines that the wafers (W) in transfer modules CPL1, CPL2 may be transferred to carry-out buffer module 15 at step S4, and the wafers (W) are transferred to carry-out buffer module 15 (step S5).

If, however, it is determined that there is no space in carry-out buffer module 15, control unit 100 may determine that the wafers (W) in transfer modules CPL1, CPL2 may not be transferred to carry-out buffer module 15 at step S4, may continuously determine whether all of transfer modules CPL1, CPL2 include wafers (W) (step S6). If it is determined that only one of transfer modules CPL1, CPL2 includes at least one wafer (W), control unit 100 may determine that no wafers will be transferred to the carrier (C) or carry-out buffer module 15 on the respective cycle (step S7).

If it is determined at step S6 that all of transfer modules CPL1, CPL2 includes wafers (W), control unit 100 continuously determines whether the wafers (W) in carry-out buffer module 15 can be transferred to the carrier (C) from which the wafers (W) are unloaded (step S8). If it is determined that the carrier (C) that unloaded the wafers (W) in carry-out buffer module 15 is returned to carrier-placement unit 16, control unit 100 determines that the wafers (W) in carry-out buffer module 15 may be transferred to the carrier (C) at step S8, and the wafers (W) in carry-out buffer module 15 are transferred to the carrier (C) (step S9).

If it is determined that the carrier (C) that unloaded the wafers (W) in carry-out buffer module 15 is not returned to carrier-placement unit 16, control unit 100 determines that the wafers (W) in carry-out buffer module 15 may not be transferred to the carrier (C) at step S8, and further determines that the wafers (W) are not transferred to the carrier (C) or carry-out buffer module 15 on the respective cycle (step S10).

If it is determined at step S1 that there is no wafer in transfer modules (CPL1 and CPL2), control unit 100 determines whether there is a transferable wafer (W), except for the wafers (W) in carry-out buffer module 15, in the carrier (C) placed in carrier-placement unit 16 and carry-in buffer module 14 (step S11). If it is determined that the wafers (W) may not be transferred from the carrier (C) to carry-in buffer module 14 or from carry-in buffer module 14 to transfer modules TRS1, TRS2, TRS3, control unit 100 determines that there is no wafer to be transferred at step S11, and subsequently performs the determination of step S8.

If it is determined that the wafers (W) may be transferred from the carrier (C) to carry-in buffer module 14, or from carry-in buffer module 14 to transfer modules (TRS1, TRS2, TRS3), control unit 100 at step S11 determines that there is wafer (W) to be transferred except for the wafers in carry-out buffer module 15, and determines here as well that no wafers (W) may be transferred to the carrier (C) or carry-out buffer module 15 similar to step S10.

As a summary of the transfer operations based on the determinations as described above, when the wafers (W) in transfer modules CPL1, CPL2 can be transferred to the carrier (C), the wafers (W) may be transferred to the carrier (C) directly, bypassing carry-out buffer module 15. Also, the wafers (W) in transfer modules CPL1, CPL2 are transferred to the carrier (C), bypassing the wafers (W) transferred to carry-out buffer module 15.

Even if the wafers (W) in carry-out buffer module 15 are wafers (W) unloaded from a different carrier (C) from the wafers (W) transferred to transfer modules CPL1, CPL2, or wafers (W) from a different lot, the wafers (W) transferred to transfer modules CPL1, CPL2 may be carried in to carry-out buffer module 15, because the transfer operation is performed based on the steps described above. Therefore, wafers (W) from different lots and from different carriers (C) may coexist in carry-out buffer module 15.

Also, the wafers (W) in carry-out buffer module 15 may be transferred to the carrier (C) when there is no other wafers (W) being transferred by transfer arm 1A. If, however, every transfer modules CPL1, CPL2 houses at least a wafer (W), and the wafers (W) in these transfer modules CPL1, CPL2 cannot be transferred to either the carrier (C) or carry-out buffer module 15, the wafers (W) in carry-out buffer module 15 may be transferred to the carrier (C). After the wafers (W) in carry-out transfer module 15 are transferred, the wafers (W) in transfer modules CPL1, CPL2 are transferred. In particular, if there exist a plurality of wafers (W) to be transferred according to the determination processes as described above, wafers (W) that carried in to processing block E2 earlier may be transferred first.

Referring to FIGS. 8 through 13, the transfer path of wafers (W) directed from processing block E2 to the carrier (C) is explained on each transfer occasion of carrier block E1. In the description to be follow, for the convenience, each wafer (W) is represented as an alphabetical order such as A, B . . . according to the sequence of lots transferred to processing block E2. And after the alphabetical order, a sequence number is added indicating a sequence order that a specific wafer (W) of a specific lot is transferred to processing block E2. Namely, for example, a third wafer (W) transferred to processing block E2 which belongs to lot A may be represented as A3. Also, a fifth wafer (W) transferred to processing block E2 on a next lot B may be represented as B5.

Figure 8:
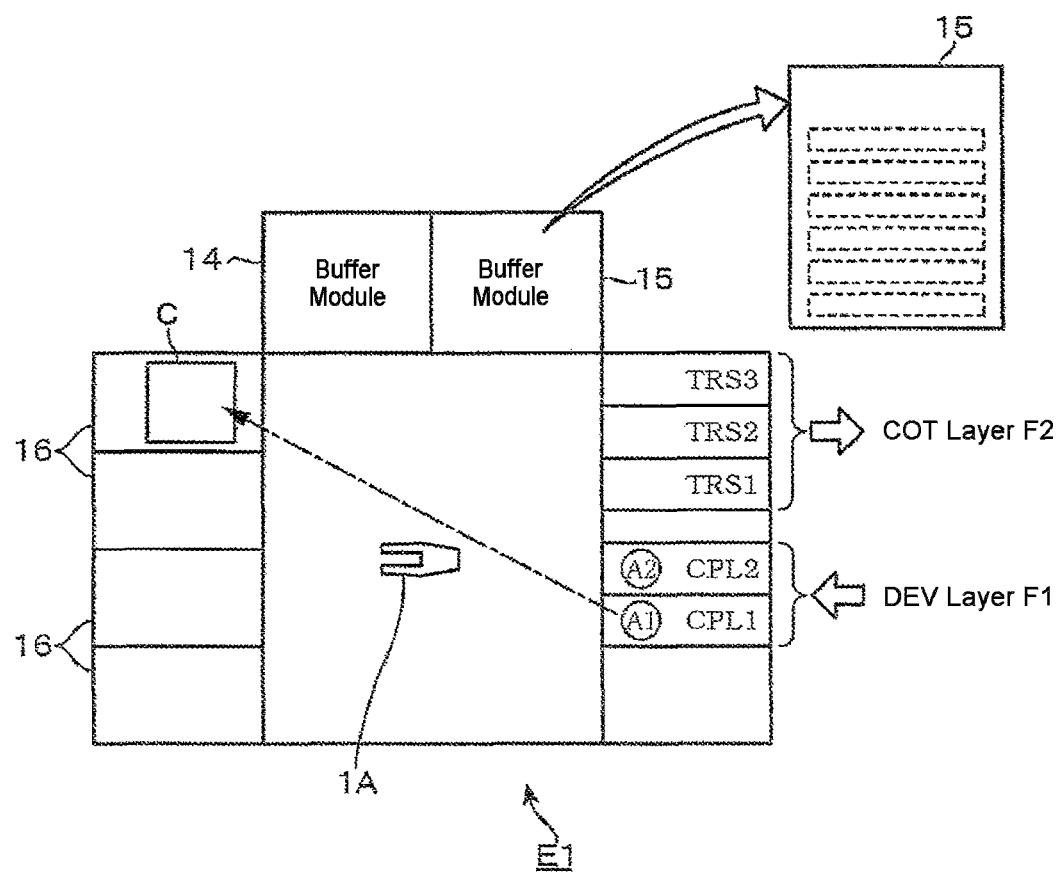
FIG. 8 illustrates a transfer path of a substrate on the carrier block of the resist application/development apparatus.

Each of FIGS. 8-13 illustrates an expanded view for each module of carrier block E1 and shelf unit U5 on the same plane, and the placement status of the wafers (W) of carry-out module 15. FIG. 8 illustrates the placement status of wafers A1, A2 of lot A transferred to processing block E2 along the transfer path described above. It is indicated in FIG. 8 that the carrier (C) that unloaded lot A is already returned to carrier-placement unit 16 and ready to house wafer A. At this time, control unit 100 already performed the operations of steps S1, S2, S3 sequentially as described above, and transfers wafer A1 of transfer module CPL1 to the carrier (C).

Figure 9:
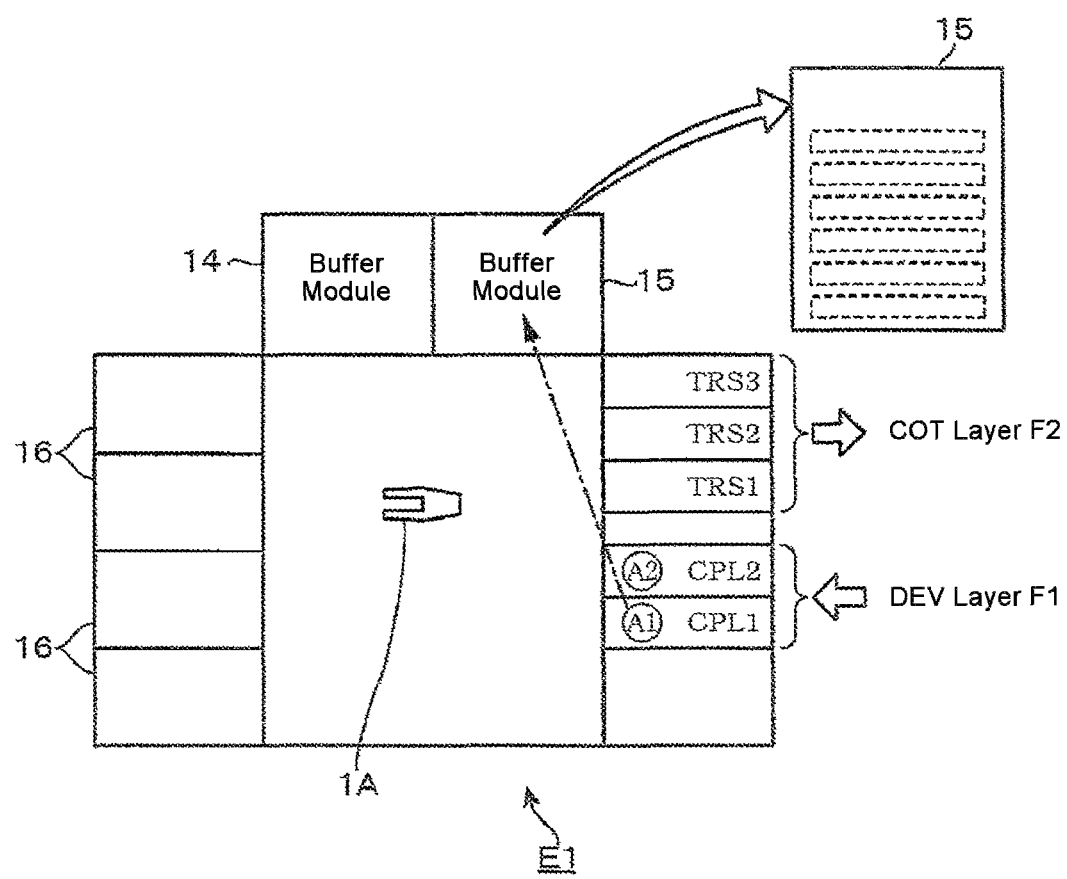
FIG. 9 illustrates a transfer path of a substrate on the carrier block of the resist application/development apparatus.

FIG. 9 illustrates a transfer status somewhat different from FIG. 8 in that the carrier (C) is not returned to carrier-placement unit 16. Also, wafers (W) are not carried in to carry-out buffer module 15. At this time, control unit 100 sequentially performs the operations of steps S1, S2, S4, S5, and transfers wafer A1 to carry-out buffer module 15. In this transfer situation as illustrated in FIG. 9, even when carry-out buffer module 15 is not empty, and, as described above, wafers (W) of a different lot from lot A or wafers (W) from a different carrier (C) from the carrier (C) that unloaded lot A are residing in carry-out buffer module 15, wafer A1 may still be transferred to carry-out buffer module 15 if there is a space in carry-out buffer module 15.

Figure 10:
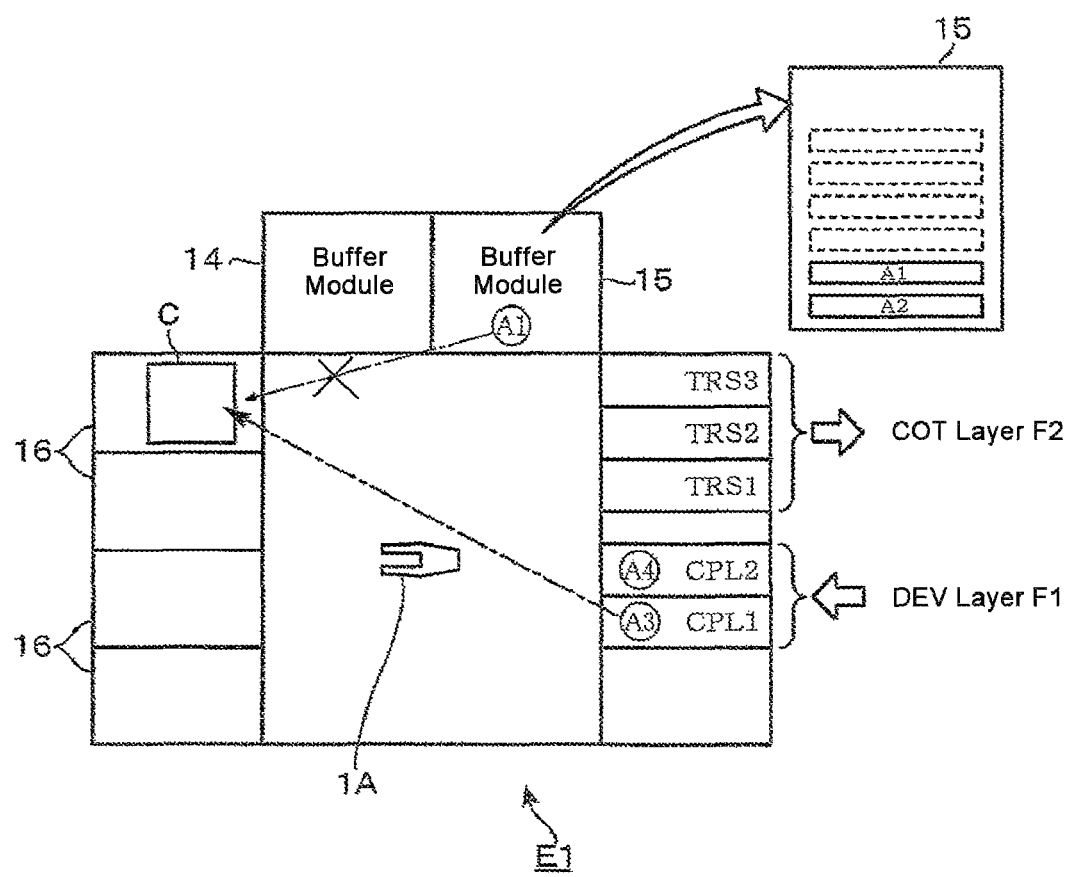
FIG. 10 illustrates a transfer path of a substrate on the carrier block of the resist application/development apparatus.

FIG. 10 illustrates a transfer status where wafers A1, A2 of lot A are residing in carry-out buffer module 15, and wafers A3, A4 are transferred to transfer modules CPL1, CPL2. The carrier (C) that unloaded lot A has been returned to carrier-placement unit 16. In this case, control unit 100 sequentially performs steps S1, S2, S3, and wafer A3 of transfer module CPL1 is transferred to the carrier (C) ahead of wafers A1, A2 of carry-out buffer module 15.

As described in FIG. 10, when wafers (W) can be transferred from each of carry-out buffer module 15 and transfer modules CPL1, CPL2 to carrier (C), the wafers (W) may be transferred from transfer modules CPL1, CPL2 and transfer modules CPL1, CPL2 become a state where the wafers (W) may be carried in to transfer modules CPL1, CPL2. At the state according to FIG. 10, even if wafers (W) residing in carry-out buffer module 15 belong to a different lot from wafers (W) transferred to transfer modules CPL1, CPL2, or unloaded from different carriers, a transfer operation may be performed from transfer modules CPL1, CPL2 to the carrier (C).

Figure 11:
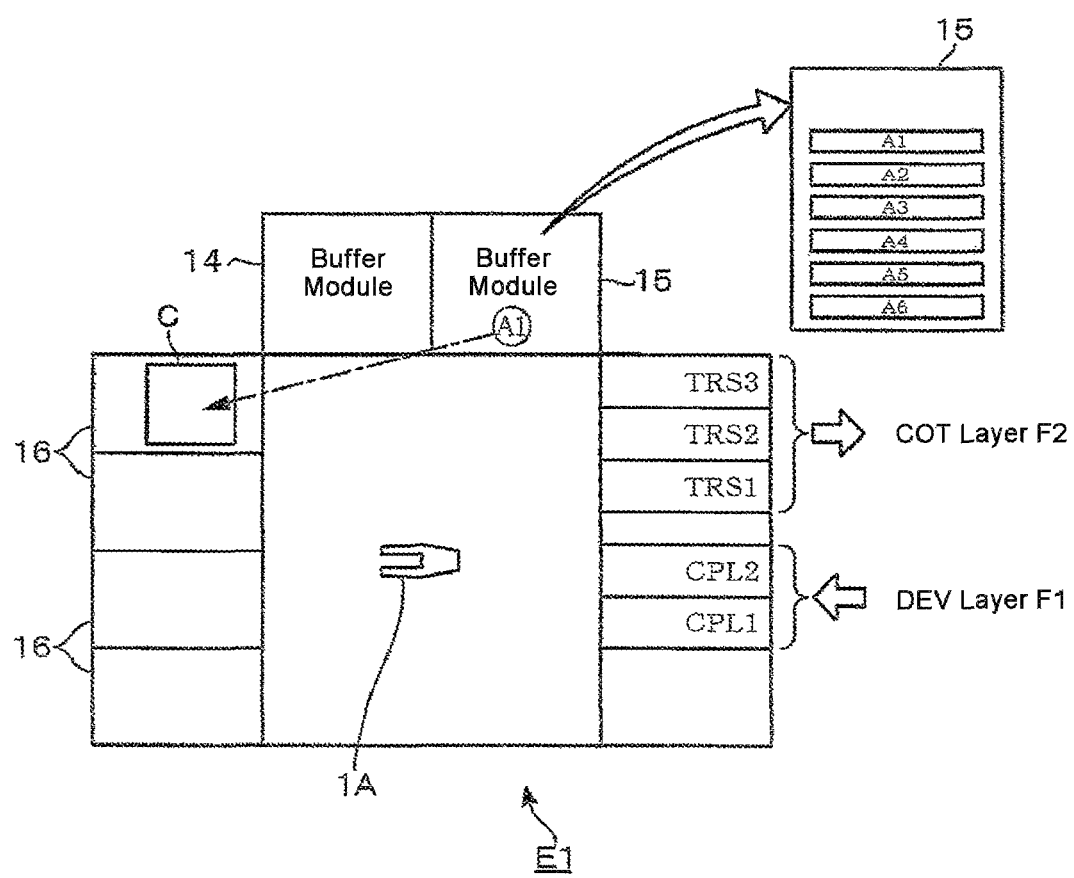
FIG. 11 illustrates a transfer path of a substrate on the carrier block of the resist application/development apparatus.

FIG. 11 illustrates a transfer state where wafers A1, A2, A3, A4, A5, A6 of lot A reside in carry-out buffer module 15 so that carry-out buffer module 15 is full, and wafers (W) are not transferred to transfer modules CPL1, CPL2. Moreover, it is assumed that although the carrier (C) that unloaded lot A is returned to carrier-placement unit 16, other carrier (C) that that unloaded wafers (W) to processing block E2 is not returned except for the returned carrier (C), and there is no wafers (W) waiting for a transfer from carry-in buffer module 14 to transfer modules TRS1, TRS2, TRS3. At this state, control unit 100 sequentially performs steps S1, S11, S8, S9, and wafer A1, which has the lowest number among the wafers (W) carried in to carry-out buffer module 15, is transferred to the carrier (C).

Also, in FIG. 11, when the carrier (C) that houses lot A has not been returned to carrier-placement unit 16, control unit 100 sequentially performs steps S1, S11, S8, S10, and as a result, wafer A of carry-out buffer module 15 is not transferred.

Figure 12:
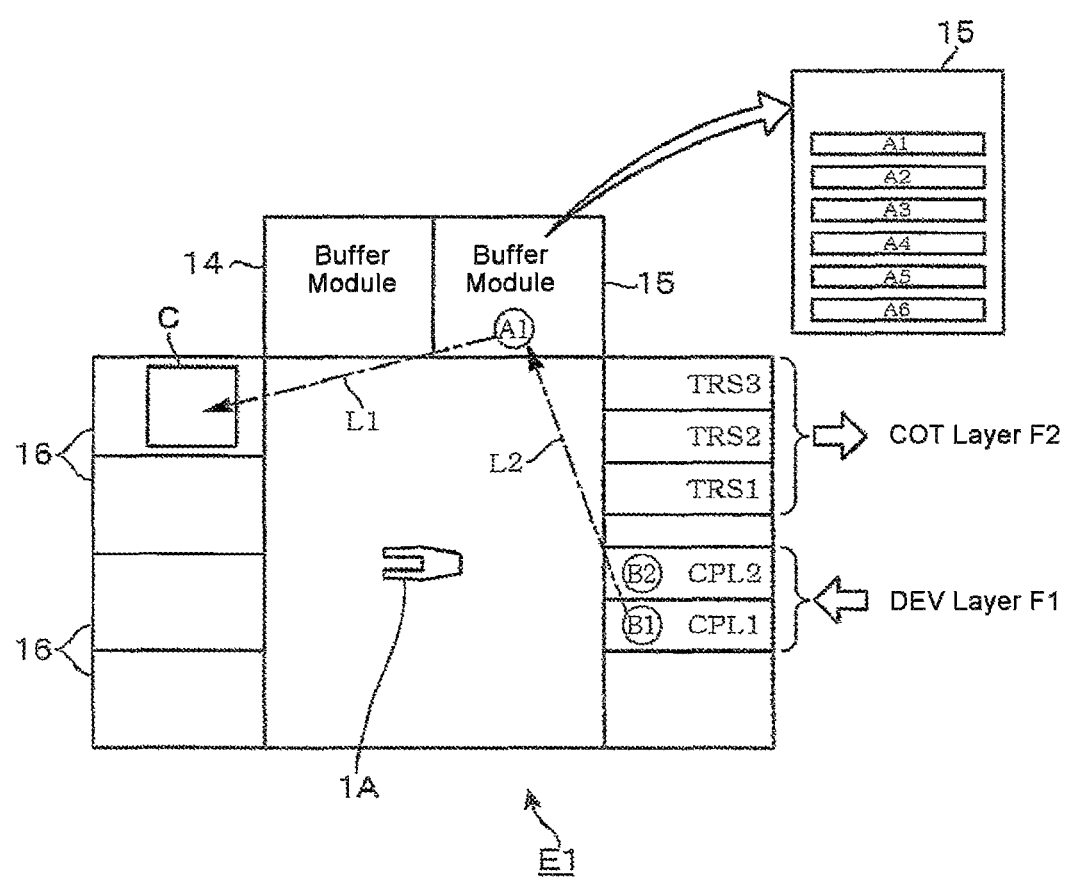
FIG. 12 illustrates a transfer path of a substrate on the carrier block of the resist application/development apparatus.

FIG. 12 illustrates a transfer state where wafers A1, A2, A3, A4, A5, A6 of lot A reside in carry-out buffer module 15 so that carry-out buffer module 15 is full, and wafers B1, B2 of lot B are transferred to transfer modules CPL1, CPL2. While lot A and lot B are unloaded from different carriers (C) and the carrier (C) that unloaded lot A has been returned to carrier-placement unit 16, the carrier (C) that unloaded lot B has not been returned to carrier-placement unit 16. In this situation, control unit 100 sequentially performs steps S1, S2, S4, S6, S8, S9, and as indicated with dotted-arrow line L1 of the figure, wafer A1 which has the lowest number among the wafers (W) transferred to carry-out buffer module 15 is transferred to the carrier (C).

Furthermore, it is assumed that each of wafers in carrier block E1 resides in the same module as in FIG. 12, except that there is a space in carry-out buffer module 15 because of the transfer of wafer A1. With the state, control unit 100 sequentially performs steps S1, S2, S4, S5, and as indicated with dotted-arrow line L2 of the figure, wafer B1 is transferred to carry-out buffer module 15.

Figure 13:
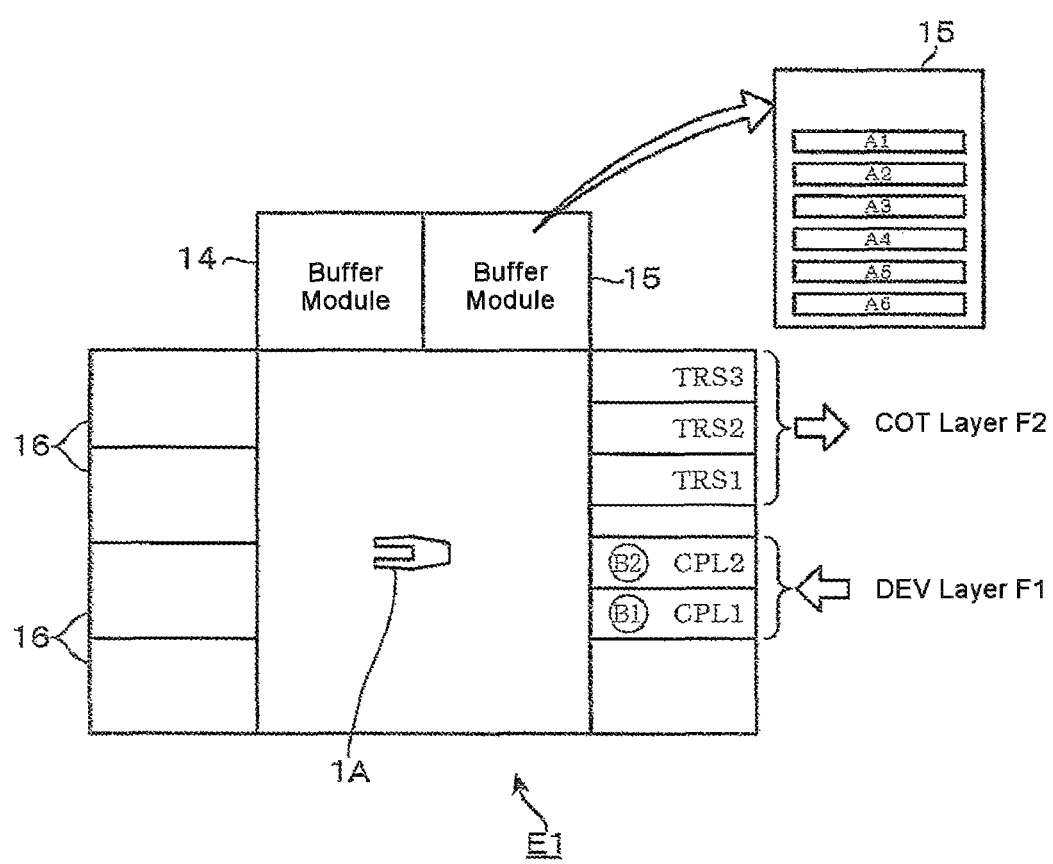
FIG. 13 illustrates a transfer path of a substrate on the carrier block of the resist application/development apparatus.

While FIG. 13 illustrates a transfer state where wafers A1, A2, A3, A4, A5, A6 are residing in carry-out buffer module 15 and wafers B1, B2 of lot B have been transferred to transfer module CPL1, CPL2, like FIG. 12, the carrier (C) that houses wafers A1, A2, A3, A4, A5, A6 has not been transferred to carrier-placement unit 16. In this situation, control unit 100 performs steps S1, S2, S4, S6, S8, S10 sequentially, and does not transfer wafers from processing block E2 to the carrier (C).

According to resist application/development apparatus 1 of the present disclosure, when wafers (W) of transfer modules CPL1, CPL2 cannot be transferred directly to the carrier (C) that unloaded the wafers (W), the wafers (W) are transferred to carry-out buffer module 15 instead. When the wafers (W) can be transferred directly from transfer modules CPL1, CPL2 to the carrier (C) that unloaded the wafers (W) regardless of whether there is a wafer or not in carry-out buffer module 15, the wafers (W) are transferred to the carrier (C). Accordingly, the number of operations by transfer arm 1A is reduced, as compared to the case where every wafers (W) are transferred to carrier (C) via carry-out buffer module 15. As a result, since the wafers (W) can be returned to carrier (C) promptly according to the present disclosure, the work processing amount is improved.

Moreover, since wafers (W) do not need to stay a relatively long time in transfer modules CPL1, CPL2 because the wafers (W) are transferred to carry-out buffer module 15, the wafers (W) do not need to be stopped to prevent a situation where a second wafer (W) brought into processing block E2 later than a first wafer (W) bypasses the first wafer (W).

Wafers (W) carried in to carry-out buffer module 15 are transferred to carrier (C) when every transfer modules CPL1, CPL2 houses wafers (W) and these wafers (W) may not be transferred to the carrier (C), and when there is no wafers (W) in transfer modules CPL1, CPL2 and there is no wafers (W) to be transferred to processing block E2 from the carrier (C) or carry-in buffer module 14. Accordingly, the work processing amount is improved because the processing in processing block E2 is prevented from being affected.

With the examples described above, CPL1 and CPL2 are set up as a carry-out module (a second transfer module). However, the number of carry-out modules are not limited by two, but may be three, for example, CPL1, CPL2, CPL3. Alternatively, either one or two of transfer modules TRS1, TRS2, TRS3 may be set up as carry-out modules. A target module of the determination processes by control unit 100 as illustrated in FIG. 7 may vary depending on the modules set up as a carry-out module. For example, control unit 100 determines at step S1 whether there is any wafer in CPL1, CPL2 because CPL1 and CPL2 are set up as carry-out modules. If, however, CPL1, CPL2, TRS1 are set up as carry-out modules, control unit 100 may determine whether there is a wafer in any of these modules. Moreover, the number of carry-out buffer module 15 and wafers (W) housed in carry-out buffer module 15 are not limited by the examples described above. For example, carry-in buffer module 14 may be utilized as carry-out buffer module 15, and in this instance, wafers (W) may be transferred from carrier (C) directly to transfer modules TRS1, TRS2, TRS3 which are carry-in modules (first transfer modules).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
    placing a carrier that houses a plurality of substrates into a carrier-placement unit;
    transferring an unloaded carrier between a retreat-placement unit prepared for retreating the carrier and the carrier-placement unit, where the unloaded carrier indicates a carrier from which the plurality of substrates are taken out;
    processing the plurality of substrates one by one by one or more processing modules disposed at a processing block;
    transferring the plurality of substrates by a first-transfer mechanism between a carrier placed in the carrier-placement unit, a first-transfer module, a second-transfer module, and a buffer module, where the first transfer module is configured to temporarily place the plurality of substrates from the carrier before the plurality of substrates are transferred to the processing block, the second transfer module is configured to temporarily place the plurality of substrates processed by the processing block, and the buffer module is configured to house the plurality of substrates taken out from the second-transfer module so that the plurality of substrates taken out from the second-transfer module can be held before the plurality of substrates are returned to the carrier;
    transferring the plurality of substrates by a second-transfer mechanism between the first-transfer module, the second-transfer module and a module disposed in the processing block, where the second-transfer mechanism transfers the plurality of substrates in such a way that a substrate brought to the first-transfer module later does not bypass a substrate brought to the first-transfer module earlier;
    when the second-transfer module houses at least one substrate and the carrier that can house the at least one substrate is not placed in the carrier-placement unit, transferring the at least one substrate housed at the second-transfer module to the buffer module; and
    when the second-transfer module houses at least one substrate and the carrier that can house the at least one substrate is placed in the carrier-placement unit, transferring the at least one substrate housed in the second-transfer module to the carrier, regardless of whether or not a substrate is being transferred from the buffer module to the carrier.

2. The substrate processing method according to claim 1, further comprising transferring a substrate transferred to the buffer module to the carrier, when the carrier that can house the substrate is placed in the carrier-placement unit, when there is no substrate being transferred in the second-transfer module, and when there is no substrate being transferred from the carrier to the first transfer module.

3. The substrate processing method according to claim 1, further comprising transferring a substrate transferred to the buffer module to the carrier, when the carrier that can house the substrate is placed in the carrier-placement unit and another carrier that can house a substrate transferred to the second-transfer module is not placed in the carrier-placement unit.

4. The substrate processing method according to claim 3, wherein the substrate processing apparatus includes a plurality of the second-transfer modules, and a substrate transfer operation is performed from the buffer module to the carrier when each of the plurality of the second-transfer modules houses at least one substrate, and the substrate transfer operation is not performed from the buffer module to the carrier when at least one of the plurality of the second transfer modules does not house a substrate.

5. The substrate processing method according to claim 1, wherein the processing step that processes the plurality of substrates one by one further includes applying a resist, and applying a developing solution after the resist is applied and the substrate applied with the resist is exposed to a light.

6. A computer-readable medium storing a computer program that, when executed, causes a computer to control a substrate processing apparatus to perform the substrate processing method according to claim 1, wherein the substrate processing apparatus comprises a processing block including one or more processing module that processes the plurality of substrates one by one, and a transfer mechanism that transfers at least one of the plurality of substrates processed at the processing block to the carrier.

* * * * *